(12) United States Patent
Lee et al.

(10) Patent No.: US 6,993,702 B2
(45) Date of Patent: Jan. 31, 2006

(54) RADIX-N ARCHITECTURE FOR DEINTERLEAVER-DEPUNCTURER BLOCK

(75) Inventors: Seok-Jun Lee, Savoy, IL (US); Manish Goel, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 320 days.

(21) Appl. No.: 10/322,875

(22) Filed: Dec. 18, 2002

(65) Prior Publication Data

US 2004/0123226 A1  Jun. 24, 2004

(51) Int. Cl.
*H03M 13/03* (2006.01)
(52) U.S. Cl. ...................... 714/790; 714/795
(58) Field of Classification Search ........... 714/795, 714/786, 790
See application file for complete search history.

(56) References Cited

U.S. PATENT DOCUMENTS

| 5,943,371 A * | 8/1999 | Beale et al. ............... 375/341 |
| 6,335,922 B1 * | 1/2002 | Tiedemann et al. .......... 370/335 |
| 6,732,326 B2 * | 5/2004 | Choi et al. ................. 714/790 |

* cited by examiner

*Primary Examiner*—Shelly Chase
*Assistant Examiner*—Esaw Abraham
(74) *Attorney, Agent, or Firm*—Frederick J. Telecky, Jr.; W. James Brady, III

(57) ABSTRACT

A de-interleaver-de-puncturer architecture is scalable and capable of achieving a higher data throughput than that achievable using a conventional disjointed de-interleaver-de-puncturer architecture. The higher data throughput is achieved without increasing the clock speed of the de-interleaver. The scalable de-interleaver-de-puncturer architecture is also less complex than a conventional disjointed de-interleaver-de-puncturer architecture.

3 Claims, 6 Drawing Sheets

US 6,993,702 B2

RADIX-N ARCHITECTURE FOR DEINTERLEAVER-DEPUNCTURER BLOCK

BACKGROUND OF THE INVENTION

1. Field of the Invention

This invention relates generally to digital communication system decoders. More particularly, this invention relates to a radix-N architecture implemented with a joint de-interleaver/de-puncturer block. The radix-N architecture, which typically precedes a radix-N Viterbi decoder in a digital communication system, is scalable and requires less hardware than a conventional disjointed de-interleaver/de-puncturer architecture.

2. Description of the Prior Art

FIG. 1 illustrates a block diagram of a decoder 100 for a typical digital communication system. The main components of decoder 100 include de-interleaver 102, de-puncturer 104, Viterbi decoder 106, and descrambler 108. The port widths are shown for a 2×2 multi-input multi-output (MIMO) enabled system with $2^k$-QAM, and an m-bit soft symbol for a Viterbi decoder having a 1/n rate code.

The symbol rate fsym for an orthogonal frequency division multiplexing (OFDM) system is defined as fsym=Ndata/Tburst, where Ndata is the number of OFDM tones per burst and Tburst is the burst duration. As an example, consider a MIMO enabled WLAN system with 108 Mb/s corresponding to k=6 (64-QAM), m=4 (4 soft information bits, design choice based on performance), n=4/3 (corresponding to 3/4 rate convolution code), fsym=12 MHz (symbol rate) and fbit=108 MHz (decoded bit rate). This particular system 200 is shown in FIG. 2.

Implementation of the forward error correction (FEC) blocks 102, 104 is dependant upon the decoded bit rate and clock frequency. If the clock frequency, for example, is 80 MHz, the port widths for one possible implementation 300 are shown in FIG. 3. This requires radix-4 implementation of de-puncturer 104 and Viterbi decoder 106.

To improve bit-error performance of the communication link, an interleaver in the transmitter and a de-interleaver in the receiver are employed. But, these data permutation operations are non-linear; and hence the address access pattern is irregular. Thus, the address pattern must be stored in a lookup table. A conventional de-interleaver and de-puncturer producing 1-bit per clock can be implemented as shown in FIG. 4 that shows a conventional de-interleaver block diagram 400, where the de-puncturer 104 needs to give an address increase signal to the de-interleaver controller 402 whenever the de-interleaved data is necessary. If a radix-4 de-interleaver and de-puncturer need to be implemented by employing FIG. 4 architecture, a 4-times higher clock speed must be used in the de-interleaver as shown in FIG. 5 (54 M samples/sec→216 M samples/sec) that shows a radix-4 de-interleaver and de-puncturer block diagram 500.

In view of the foregoing, it is both advantageous and desirable to provide a de-interleaver/de-puncturer architecture that is scalable and that is capable of achieving a higher data throughput than that achievable using a conventional disjointed de-interleaver/de-puncturer architecture. It would also be advantageous and desirable if the scalable de-interleaver/de-puncturer architecture were less complex than a conventional disjointed de-interleaver/de-puncturer architecture. It would further be advantageous and desirable if the scalable de-interleaver/de-puncturer architecture could achieve a higher data throughput without increasing the clock speed of the de-interleaver.

SUMMARY OF THE INVENTION

The present invention is directed to a de-interleaver/de-puncturer architecture that is scalable and that is capable of achieving a higher data throughput than that achievable using a conventional disjointed de-interleaver/de-puncturer architecture. The scalable de-interleaver/de-puncturer architecture is less complex than a conventional disjointed de-interleaver/de-puncturer architecture while achieving a higher data throughput without increasing the clock speed of the de-interleaver.

According to one embodiment, a de-interleaver/de-puncturer system comprises at least one 2-port RAM configured to store de-interleaved data in response to at least one write address and write data, and further configured to output de-interleaved data in response to at least one read address; a de-interleaver address controller configured to generate the at least one read address and further configured to generate at least one data valid signal; and at least one multiplexer configured to generate de-punctured data in response to the de-interleaved output data, the at least one data valid signal, and at least one null bit.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 6:
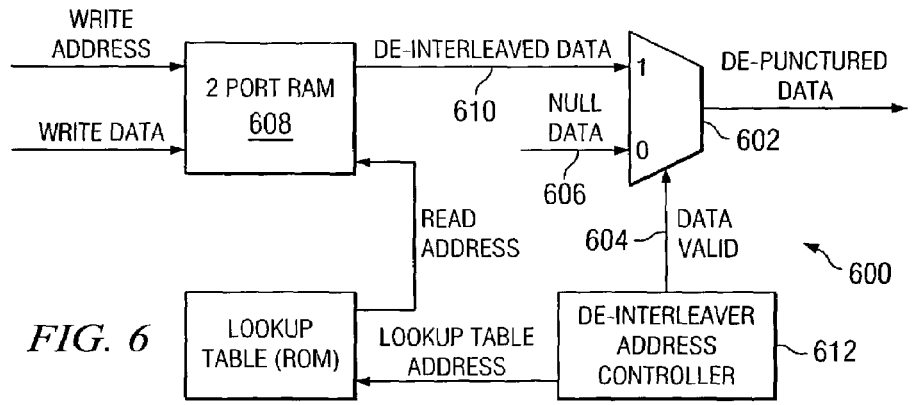
FIG. 6 is a diagram showing a de-interleaver/de-puncturer joint architecture according to one embodiment of the present invention.

FIG. 6 is a diagram showing a de-interleaver/de-puncturer joint architecture 600 according to one embodiment of the present invention. The joint architecture 600 of a de-interleaver and de-puncturer can be seen to employ a muxtiplexer 602 instead of a more conventional de-puncturer. If a dummy (null) bit needs to be inserted in place of the punctured bits, a data valid signal 604 selects "Null data" 606; and otherwise, data valid signal 604 selects the output of 2-port RAM 608, de-interleaved data 610. The "data valid" 604 signal needs to be produced by the de-interleaver controller 612.

Figure 7:
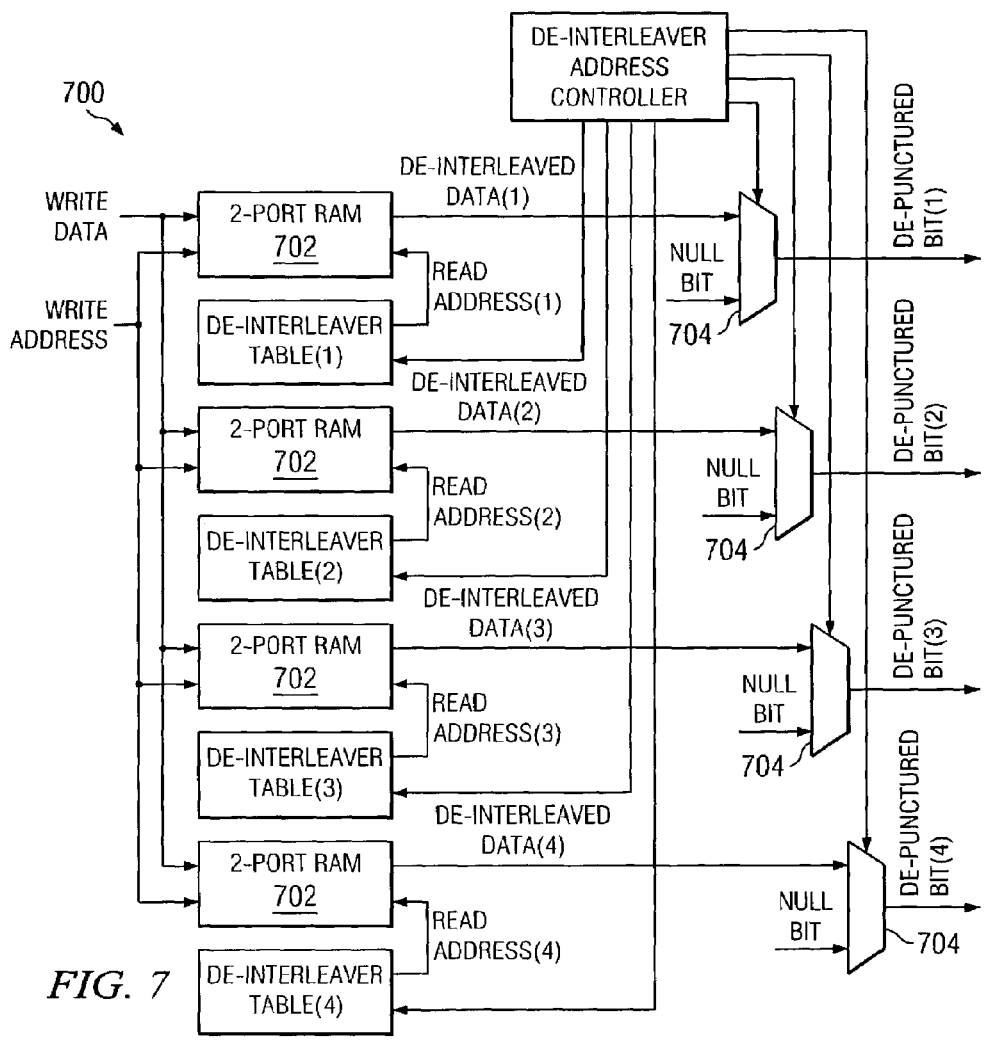
FIG. 7 is a diagram showing a radix-4 de-interleaver/de-puncturer joint architecture using the architecture shown in FIG. 6.

The de-interleaver/de-puncturer joint architecture 600 advantageously is scalable; and hence a radix-4 de-interleaver and de-puncturer can be implemented as shown in FIG. 7, where FIG. 7 is a diagram showing a radix-4 de-interleaver/de-puncturer joint architecture 700 using the architecture 600 shown in FIG. 6. It is obvious that N 2-port RAMs 702 and N multiplixers 704 will be implemented if radix-N architecture is required, but that the clock speed of the de-interleaver is unchanged at the cost of area increase due to increased numbers of components.

Figure 8:
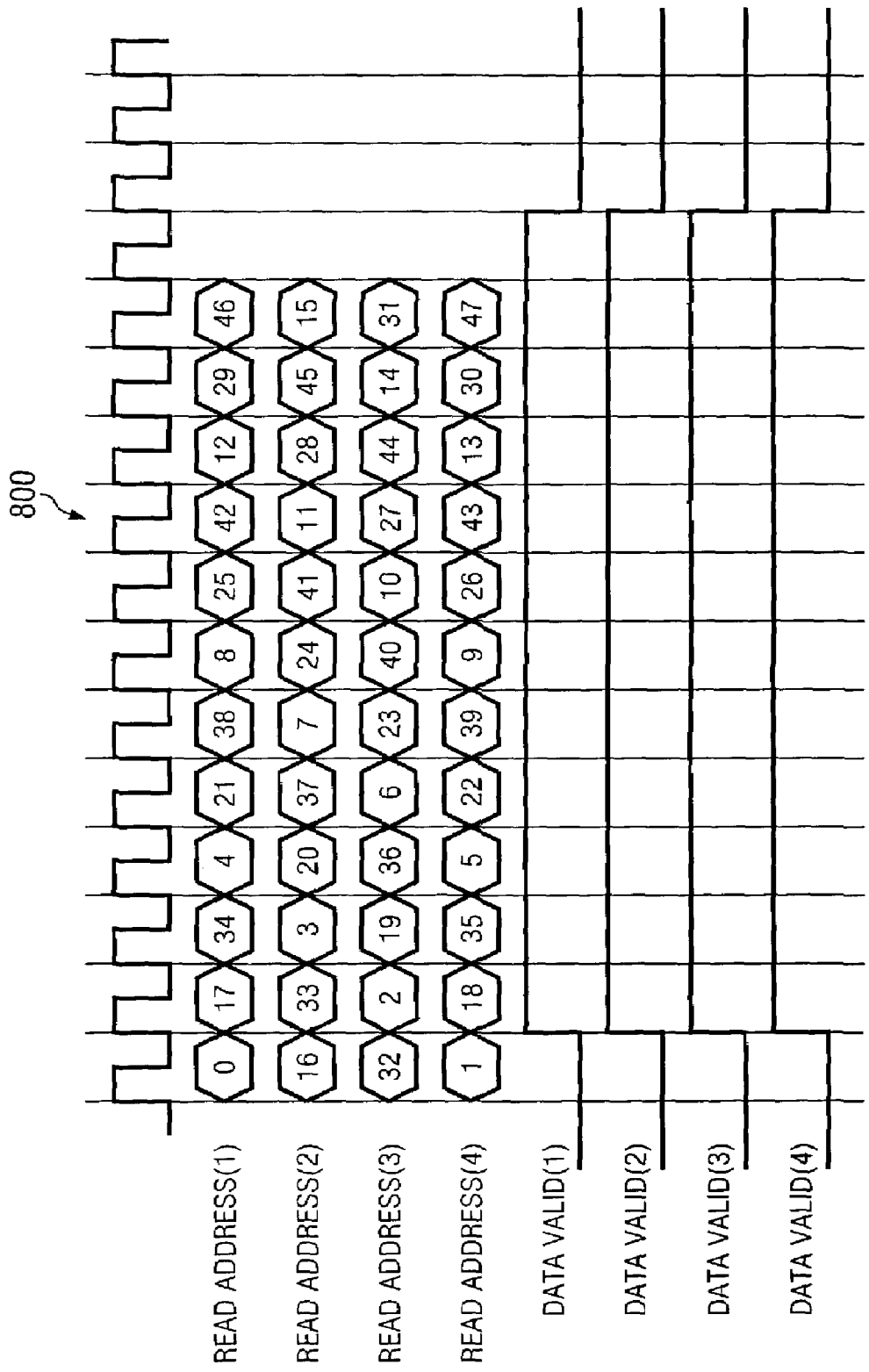
FIG. 8 shows the resultant read address and data valid control waveform signals for a 48-entity de-interleaver with a 1/2 code rate, using the architecture shown in FIGS. 6 and 7.
Figure 9:
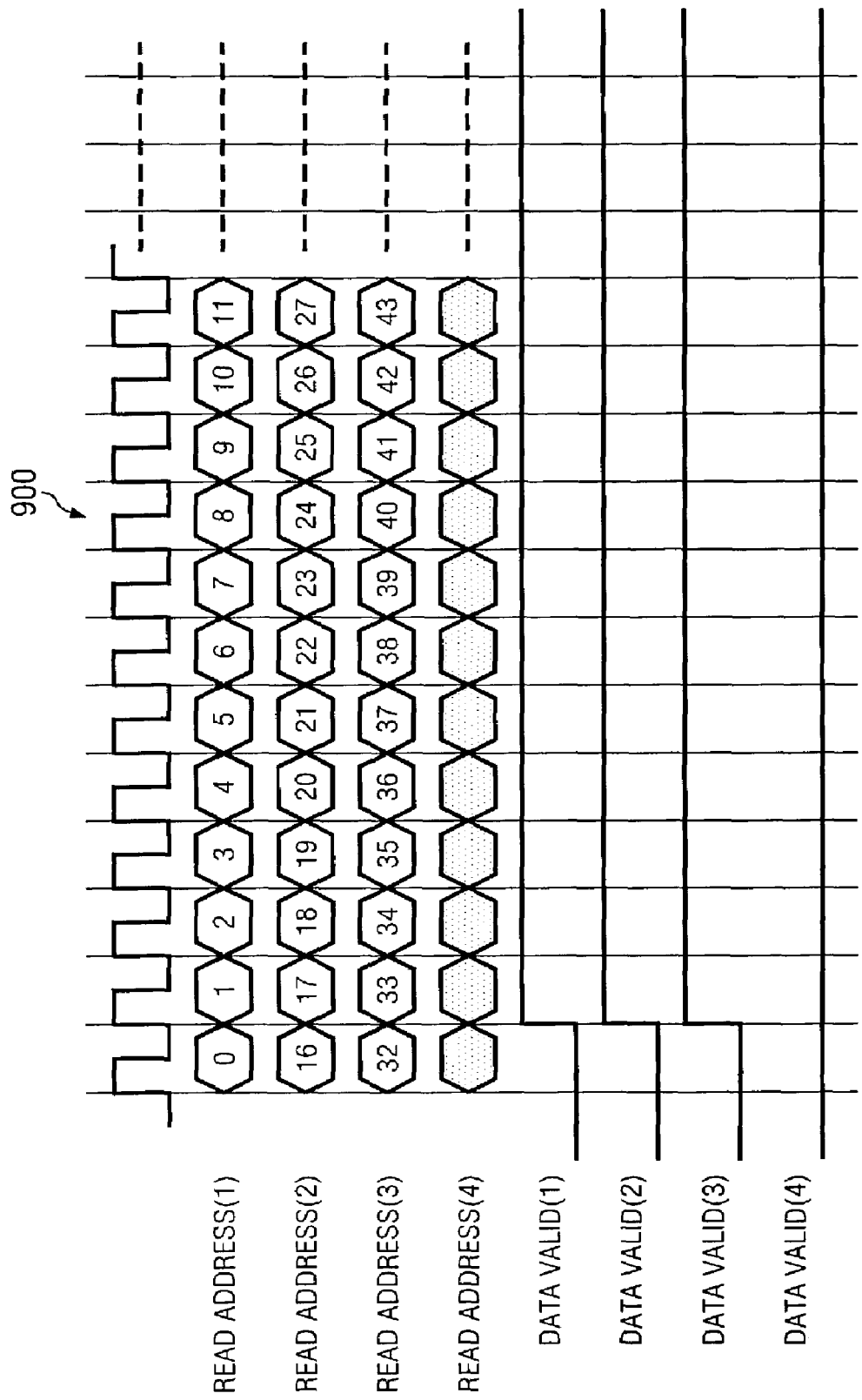
FIG. 9 shows the resultant read address and data valid control waveform signals for a 48-entity de-interleaver with a 2/3 code rate, using the architecture shown in FIGS. 6 and 7.
Figure 10:
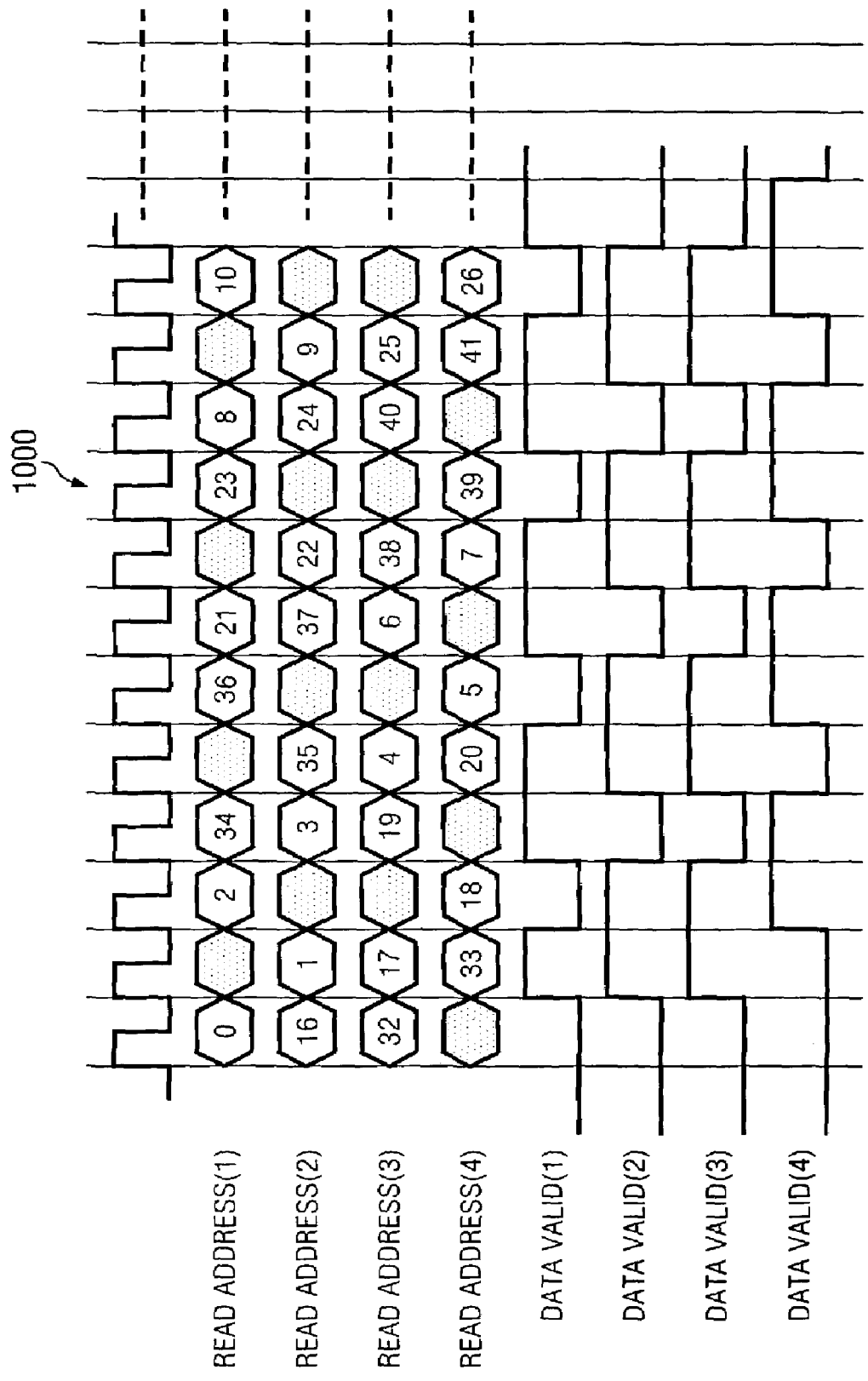
FIG. 10 shows the resultant read address and data valid control waveform signals for a 48-entity de-interleaver with a 3/4 code rate, using the architecture shown in FIGS. 6 and 7.

Operation of the radix-4 de-interleaver/de-puncturer joint architecture 700 is exemplified herein below with reference to FIGS. 8–10 and Table 1 that shows the architecture read address pattern using a lookup table size of 48 (48-entity de-interleaver lookup table).

TABLE 1

Figure 1:
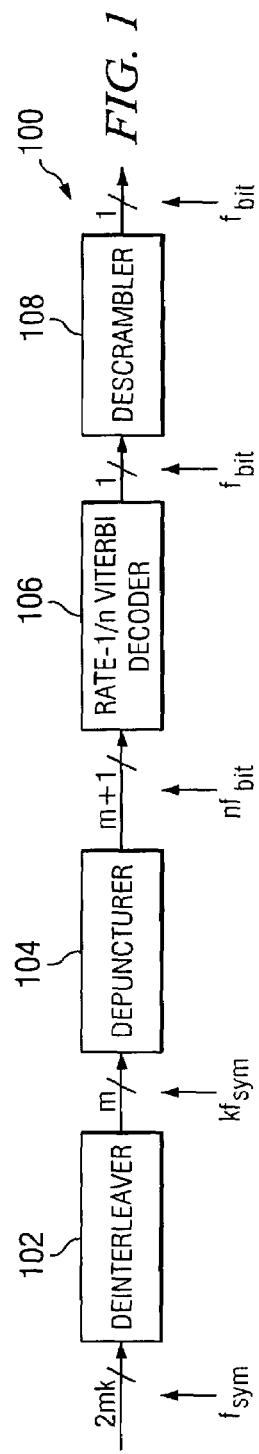
FIG. 1 is a block diagram showing a decoder in a digital communication system.
Figure 2:
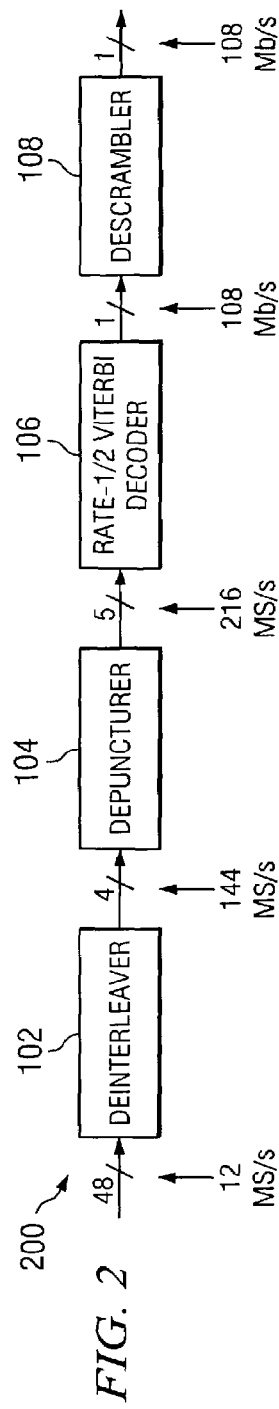
FIG. 2 is a block diagram showing data transfer rates for a 108 Mb/s decoder for a 2×2 MIMO enabled WLAN system using the system architecture shown in FIG. 1.
Figure 3:
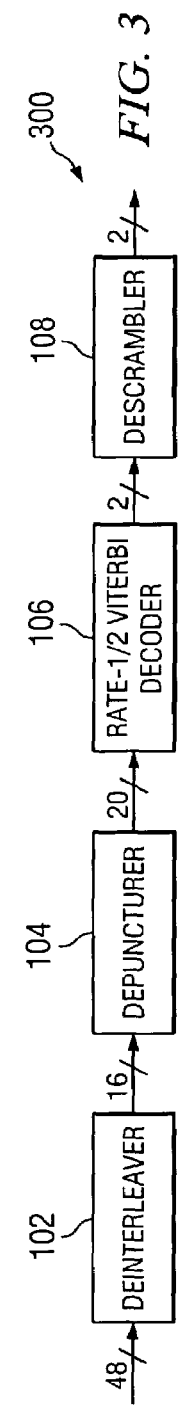
FIG. 3 is a block diagram showing port widths for operating the front-end block using the system architecture shown in FIG. 2.

FIG. 1 architecture read address pattern: Lookup table size = 48

| Lookup table Address | De-interleaver read address |
|---|---|
| 0 | 0 |
| 1 | 16 |
| 2 | 32 |
| 3 | 1 |
| 4 | 17 |
| 5 | 33 |
| 6 | 2 |
| 7 | 18 |
| 8 | 34 |
| 9 | 3 |
| 10 | 19 |
| 11 | 35 |
| 12 | 4 |
| 13 | 20 |
| 14 | 36 |
| 15 | 5 |
| 16 | 21 |
| 17 | 37 |
| 18 | 6 |
| 19 | 22 |
| 20 | 38 |
| 21 | 7 |
| 22 | 23 |
| 23 | 39 |
| 24 | 8 |
| 25 | 24 |
| 26 | 40 |
| 27 | 9 |
| 28 | 25 |
| 29 | 41 |
| 30 | 10 |
| 31 | 26 |
| 32 | 42 |
| 33 | 11 |
| 34 | 27 |
| 35 | 43 |
| 36 | 12 |
| 37 | 28 |
| 38 | 44 |
| 39 | 13 |
| 40 | 29 |
| 41 | 45 |
| 42 | 14 |
| 43 | 30 |
| 44 | 46 |
| 45 | 15 |
| 46 | 31 |
| 47 | 47 |

Then, if the code rate is 1/2, interleaving is not required. FIG. 8 shows the resultant waveform 800 for the read addresses and data valid control signals. If however, the code rate is 2/3, and every $4^{th}$ bit is punctured at the transmitter, the waveform 900 shown in FIG. 9 results for the read addresses and data valid control signals. And if, for example, the code rate is 3/4 and every $4^{th}$ and $5^{th}$ bits are punctured at the transmitter, then FIG. 10 shows the resultant waveform 1000 for the read addresses and data valid control signals.

Figure 4:
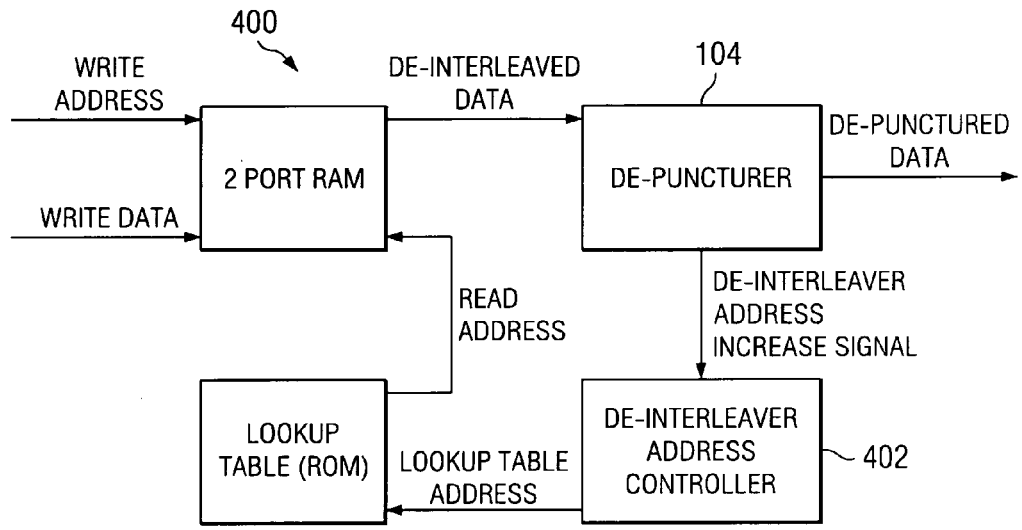
FIG. 4 is a block diagram showing a conventional de-interleaver.
Figure 5:
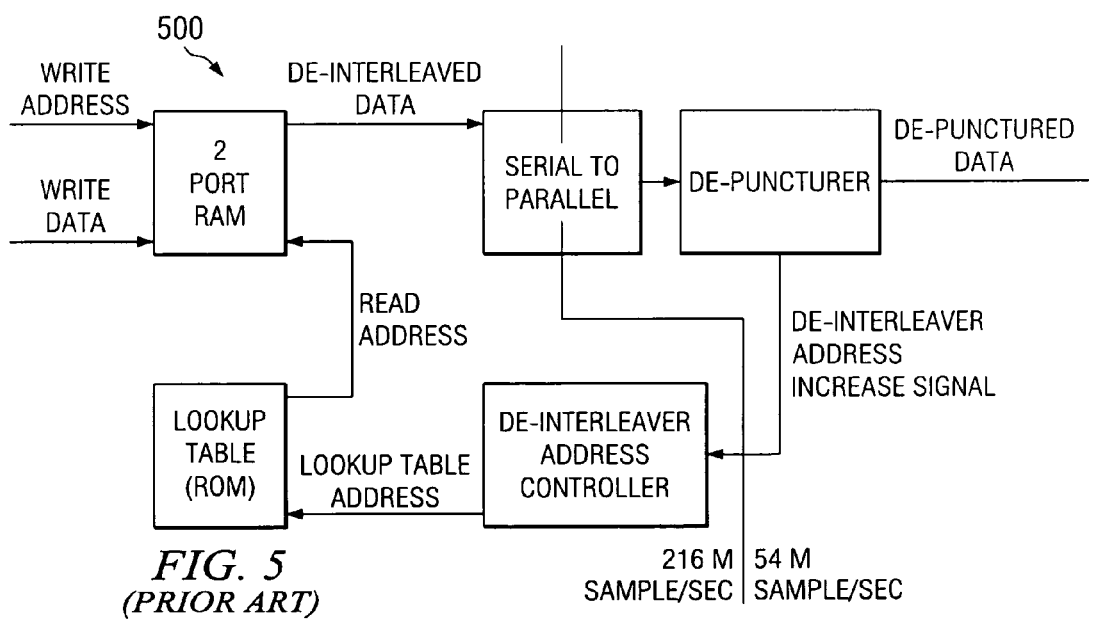
FIG. 5 is a block diagram showing a radix-4 de-interleaver and de-puncturer using the architecture shown in FIG. 4.

In summary explanation of the above, a scalable and high throughput architecture 600, 700 has been described for implanting a high radix de-interleaver and de-puncturer, in which two blocks are jointly implemented. The new radix-N architecture can support a greater N times throughput at the same clock speed as the radix-1 architecture 400 shown in FIG. 4.

In view of the above, it can be seen the present invention presents a significant advancement in the art of digital communication system decoders. Further, this invention has been described in considerable detail in order to provide those skilled in the de-interleaver and de-puncturer art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A de-interleaver/de-puncturer system comprising:
   at least one 2-port RAM configured to store de-interleaved data in response to at least one write address and write data and to output de-interleaved data in response to at least one de-interleaver read address signal;
   at least one lookup table configured to store at least one de-interleaver read address, such that the at least one lookup table generates the at least one de-interleaver read address signal in response to a least one address controller signal;

a de-interleaver address controller configured to generate the at least one address controller signal and further configured to generate at least one data valid signal;

a null data source; and at least one multiplexer configured to generate de-punctured data in response to one of the de-interleaved output data, the at least one data valid signal, and the null data source.

2. The de-interleaver/de-puncturer system according to claim 1 further comprising a ROM configured to store the at least one lookup table.

3. The de-interleaver/de-puncturer system according to claim 1 further comprising:

a rate 1/n Viterbi decoder; and a descrambler, where the at least one 2-port RAM, the at least one lookup table, de-interleaver address controller, at least one multiplexer, Viterbi decoder and descrambler are configured to provide a digital communication system decoder.

* * * * *